United States Patent
Cheng et al.

(10) Patent No.: US 11,257,720 B2
(45) Date of Patent: *Feb. 22, 2022

(54) MANUFACTURING METHOD FOR SEMICONDUCTOR DEVICE AND INTEGRATED SEMICONDUCTOR DEVICE

(71) Applicant: CSMC TECHNOLOGIES FAB2 CO., LTD., Suzhou (CN)

(72) Inventors: Shikang Cheng, Wuxi (CN); Yan Gu, Wuxi (CN); Sen Zhang, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/768,563

(22) PCT Filed: Nov. 21, 2018

(86) PCT No.: PCT/CN2018/116633
§ 371 (c)(1),
(2) Date: May 29, 2020

(87) PCT Pub. No.: WO2019/128554
PCT Pub. Date: Jul. 4, 2019

(65) Prior Publication Data
US 2020/0335607 A1 Oct. 22, 2020

(30) Foreign Application Priority Data
Dec. 28, 2017 (CN) .......................... 201711460715.5

(51) Int. Cl.
*H01L 21/336* (2006.01)
*H01L 21/8238* (2006.01)
(Continued)

(52) U.S. Cl.
CPC .... *H01L 21/823878* (2013.01); *H01L 21/266* (2013.01); *H01L 21/76224* (2013.01);
(Continued)

(58) Field of Classification Search
CPC ........... H01L 29/66712; H01L 27/0617; H01L 29/0653; H01L 29/7803; H01L 29/66333;
(Continued)

(56) References Cited

U.S. PATENT DOCUMENTS 5,510,281 A * 4/1996 Ghezzo ............... H01L 29/1608
438/268
6,166,404 A 12/2000 Imoto et al.
(Continued)

FOREIGN PATENT DOCUMENTS

CN 1866542 A 11/2006
CN 101127327 2/2008
(Continued)

OTHER PUBLICATIONS

International Search Report issued in PCT/CN2018/116633, dated Feb. 25, 2019.
(Continued)

*Primary Examiner* — Shouxiang Hu
(74) *Attorney, Agent, or Firm* — Hamre, Schumann, Mueller & Larson, P.C.

(57) ABSTRACT

A manufacturing method for a semiconductor device, and an integrated semiconductor device. The manufacturing method comprises: on a semiconductor substrate, forming an epitaxial layer having a first region, a second region, and a third region; forming at least one groove in the third region, forming at least two second doping deep traps in the first region, and forming at least two second doping deep traps in the second region; forming a first dielectric island between the second doping deep traps and forming a second
(Continued)

dielectric island on the second doping deep traps; forming a first doping groove at both sides of the first dielectric island in the first region; forming a gate structure on the first dielectric island; forming an isolated first doping source region using the second dielectric island as a mask.

20 Claims, 4 Drawing Sheets

(51) Int. Cl.
  *H01L 27/06* (2006.01)
  *H01L 29/06* (2006.01)
  *H01L 29/66* (2006.01)
  *H01L 29/78* (2006.01)
  *H01L 21/762* (2006.01)
  *H01L 21/266* (2006.01)

(52) U.S. Cl.
  CPC .... *H01L 21/76283* (2013.01); *H01L 27/0617* (2013.01); *H01L 29/0653* (2013.01); *H01L 29/66712* (2013.01); *H01L 29/7803* (2013.01)

(58) Field of Classification Search
  CPC .......... H01L 29/7395; H01L 29/42376; H01L 29/42368; H01L 29/66666; H01L 29/66734; H01L 29/7802; H01L 29/7828; H01L 21/823481; H01L 29/0649; H01L 27/088; H01L 29/7393; H01L 27/0883; H01L 27/082; H01L 21/8236; H01L 21/8222; H01L 21/823878; H01L 21/76224; H01L 21/823814; H01L 21/266; H01L 21/76283
  See application file for complete search history.

(56) References Cited

U.S. PATENT DOCUMENTS

| | | | | |
|---|---|---|---|---|
| 6,392,859 | B1* | 5/2002 | Ohshima | H01L 27/0248 361/100 |
| 10,032,766 | B2* | 7/2018 | Li | H01L 21/823878 |
| 2003/0205829 | A1 | 11/2003 | Boden, Jr. | |
| 2009/0321852 | A1 | 12/2009 | Yoneda et al. | |
| 2010/0052013 | A1 | 3/2010 | Yoshinaga et al. | |
| 2010/0144109 | A1 | 6/2010 | Park | |
| 2010/0167481 | A1 | 7/2010 | Battiato et al. | |
| 2015/0001639 | A1 | 1/2015 | Fujie | |
| 2016/0233216 | A1 | 8/2016 | Zhang et al. | |
| 2019/0051647 | A1 | 2/2019 | Weyers et al. | |
| 2019/0067424 | A1 | 2/2019 | Kudou | |
| 2020/0335498 | A1* | 10/2020 | Cheng | H01L 29/42376 |
| 2020/0350420 | A1* | 11/2020 | Cheng | H01L 29/7802 |

FOREIGN PATENT DOCUMENTS

| | | |
|---|---|---|
| CN | 101159267 | 4/2008 |
| CN | 101673743 | 3/2010 |
| CN | 102194819 | 9/2011 |
| CN | 103151268 A | 6/2013 |
| CN | 103872137 | 6/2014 |
| CN | 103928464 | 7/2014 |
| CN | 104409507 A | 3/2015 |
| CN | 105226097 | 1/2016 |
| JP | 2000323583 | 11/2000 |
| KR | 10-2000-0074360 | 12/2000 |
| KR | 10-2011-0133622 | 12/2011 |

OTHER PUBLICATIONS

Office Action issued for U.S. Appl. No. 16/957,600, dated May 12, 2021, 19 pages.

International Search Report issued for International Patent Application No. PCT/CN2018/116666, dated Jan. 30, 2019, 6 pages including English translation.

Office Action issued for U.S. Appl. No. 16/755,817, dated Mar. 3, 2021, 64 pages.

International Search Report issued for International Patent Application No. PCT/CN2018/116680, dated Feb. 22, 2019, 5 pages including English translation.

* cited by examiner

MANUFACTURING METHOD FOR SEMICONDUCTOR DEVICE AND INTEGRATED SEMICONDUCTOR DEVICE

CROSS REFERENCES TO RELATED APPLICATIONS

This patent application claims priority to Chinese patent application No. 201711460715.5, filed on Dec. 28, 2017, the disclosure of which is hereby incorporated by reference in its entirety.

TECHNICAL FIELD

The present disclosure relates to the field of semiconductor manufacturing, and particularly relates to a manufacturing method for a semiconductor device and an integrated semiconductor device.

BACKGROUND

Vertical double-diffused metal oxide field effect devices (VDMOS) include enhanced ones and depletion ones, which have advantages such as good switching performance and low power consumption, and are widely used in LED drivers and power adapters. However, most of the existing various types of VDMOS devices are packaged separately, which will lead to disadvantages such as increasing the process costs and the chip area being excessively large.

SUMMARY

A semiconductor device and a manufacturing method thereof are provided according to various embodiments of the present disclosure.

A manufacturing method for a semiconductor device, includes:

providing a semiconductor substrate, forming a first dopant type epitaxial layer having a first region, a second region, and a third region on a front surface of the semiconductor substrate, the third region is located between the first region and the second region, and forming at least one groove located in the first dopant type epitaxial layer in the third region;

forming at least two second dopant type deep wells respectively in each of the first region and the second region;

filling the groove and forming dielectric islands located on the first dopant type epitaxial layer, the dielectric islands include first dielectric islands, second dielectric islands, and a third dielectric island; the first dielectric islands partially cover a region between two adjacent second dopant type deep wells in the first region, and partially covering a region between two adjacent second dopant type deep wells in the second region; the first dielectric islands are not in contact with the two adjacent second dopant type deep wells; the second dielectric islands partially cover part of a region of each of the second dopant type deep wells in the first region, and partially covering part of a region of each of the second dopant type deep wells in the second region; the second dopant type deep wells at both sides of each of the second dielectric islands in the first region and the second dopant type deep wells at both sides of each of the second dielectric islands in the second region are regions where first dopant type source regions are to be formed; and the third dielectric island covers the groove;

forming first dopant type channel regions respectively on the epitaxial layer at both sides of the first dielectric island in the first region, the first dopant type channel regions extend to the regions in the first region where first dopant type source regions are to be formed;

forming gate structures respectively covering the first dielectric islands and the third dielectric island and on the first dopant type epitaxial layer, the gate structures exposing the second dielectric islands and the regions respectively in the first region and in the second region where first dopant type source regions are to be formed; and performing ion implantation to the first dopant type source regions using the gate structures and the second dielectric islands as a mask to form the first dopant type source regions respectively in the first region and in the second region;

the first dopant type and the second dopant type are opposite to each other.

An integrated semiconductor device includes a semiconductor device manufactured by the above described manufacturing method.

BRIEF DESCRIPTION OF THE DRAWINGS

To better describe and illustrate embodiments and/or examples of the disclosure disclosed herein, reference can be made to one or more accompanying drawings. The additional details or examples used to describe the accompanying drawings should not be construed as limiting the scope of any of the disclosed disclosure, the presently described embodiments and/or examples, and the presently understood preferred mode of the disclosure.

DETAILED DESCRIPTION

To facilitate understanding the present disclosure, the present disclosure will be described more fully hereinafter with reference to the accompanying drawings. Preferable embodiments of the present disclosure are presented in the accompanying drawings. However, the present disclosure may be embodied in many different forms and is not limited to the embodiments described herein. Rather, these embodiments are provided so that the disclosure of the present disclosure will be more thorough and complete.

All technical and scientific terms used herein have the same meaning as commonly understood by one of ordinary skill in the art to which the present disclosure applies, unless otherwise defined. The terms used in the specification of the present disclosure herein are for the purpose of describing specific embodiments only and are not intended to limit this disclosure. The term "and/or" used herein includes any and all combinations of one or more of the associated listed items.

In order to thoroughly understand the present disclosure, detailed steps and/or detailed structures will be set forth in the following description, so as to explain the technical solutions proposed by the present disclosure. Preferred embodiments of the present disclosure are described in detail below, however in addition to these detailed description, the present disclosure may have other embodiments.

Embodiment 1

In order to solve the technical problem in the prior art, the present disclosure provides a manufacturing method for a semiconductor device and an integrated semiconductor device.

The manufacturing method for a semiconductor device and the semiconductor device of the present disclosure will be described below by taking the manufacturing process of a VDMOS semiconductor device as an example. It should be understood that this embodiment being described using the manufacturing process of a VDMOS semiconductor device as an example is just illustrative, manufacturing methods of any semiconductor device integrating a depletion device and an enhanced device are applicable to the present disclosure.

The manufacturing method for a semiconductor device provided in the present disclosure is described illustratively below with reference to FIGS. 1A-1G and FIG. 2. FIGS. 1A-1G are schematic diagrams of a semiconductor device formed according to a manufacturing method for a semiconductor device of the present disclosure. FIG. 2 is a flow chart of the manufacturing method for a semiconductor device according to an embodiment of the present disclosure.

Firstly, referring to FIG. 2, at step S1: provide a semiconductor substrate, form a first dopant type epitaxial layer having a first region, a second region, and a third region on a front surface of the semiconductor substrate, the third region is located between the first region and the second region, and form a groove located in the first dopant type epitaxial layer in the third region.

Figure 1A:
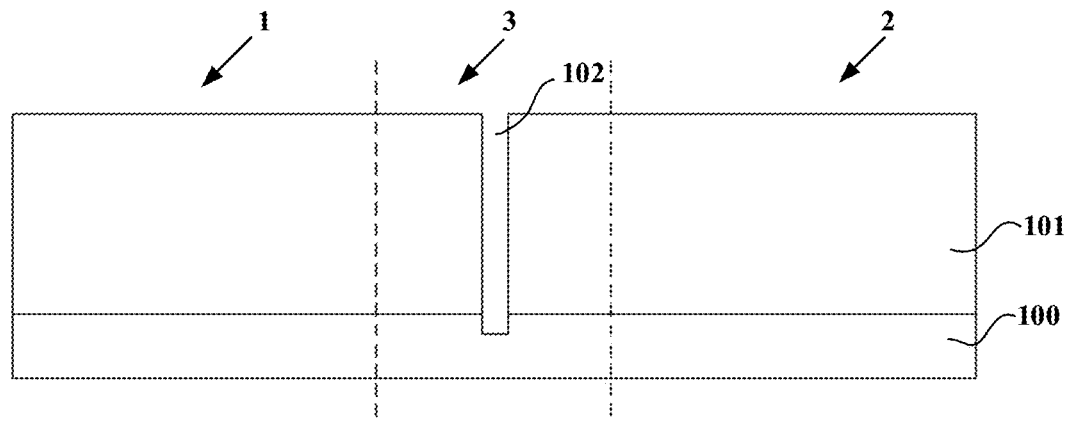
FIGS. 1A-1G are schematic diagrams of a semiconductor device formed according to a manufacturing method for a semiconductor device of the present disclosure.
Figure 2:
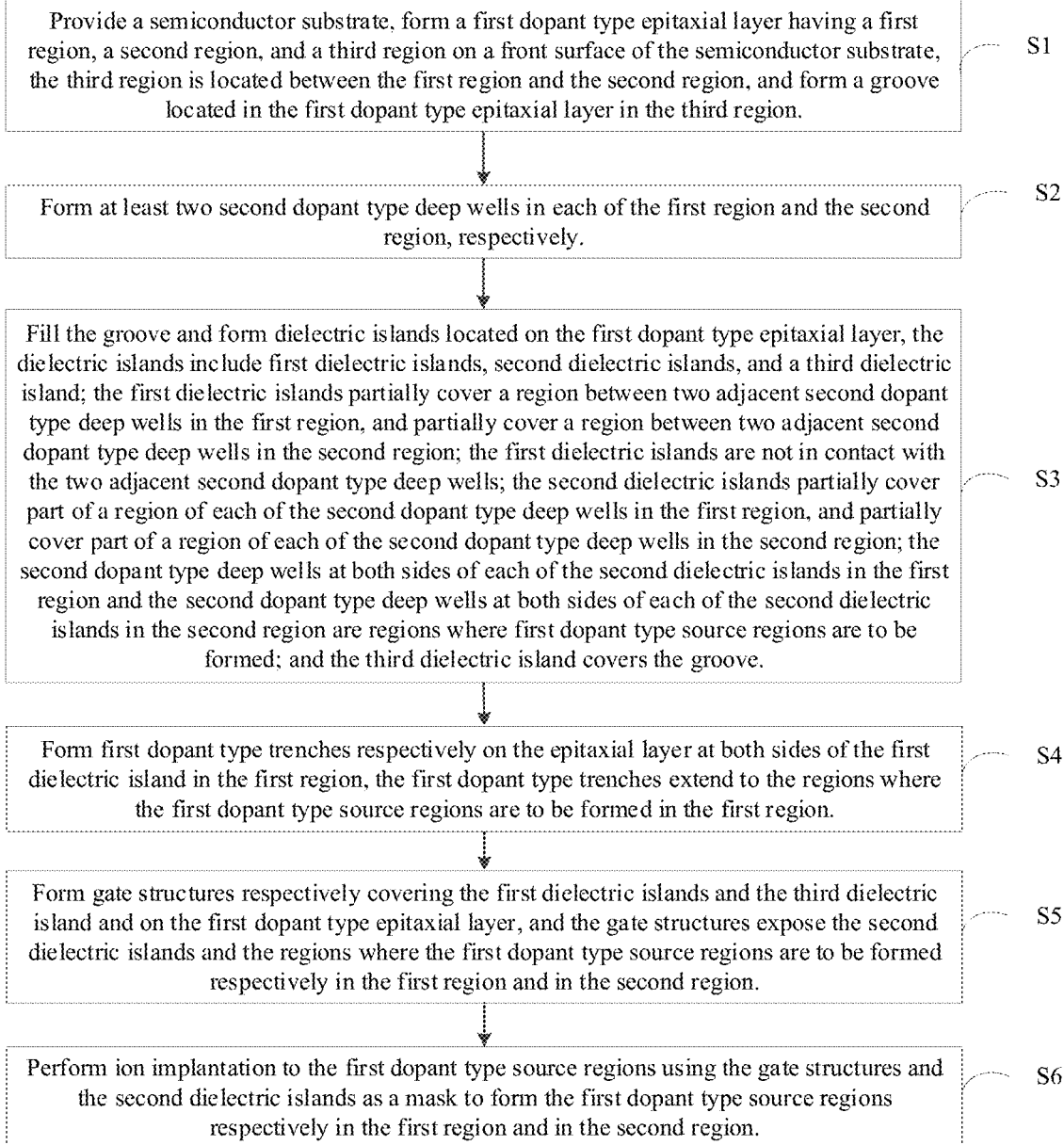
FIG. 2 is a flow chart of the manufacturing method for a semiconductor device according to an embodiment of the present disclosure.

As shown in FIG. 1A, a semiconductor substrate 100 is provided. Specifically, the semiconductor substrate 100 can be at least one of the following mentioned materials: Si, Ge, SiGe, SiC, SiGeC, InAs, GaAs, InP, InGaAs, or other III/V compound semiconductors, or it further includes multilayer structures made of these semiconductors, or it is silicon on insulator (SOI), stacked silicon on insulator (SSOI), stacked silicon germanium on insulator (S—SiGeOI), silicon germanium on insulator (SiGeOI), germanium on insulator (GeOI), and the like. Exemplarily, the semiconductor substrate is of a first dopant type.

It should be noted that the first dopant type and the second dopant type in this specification generally refer to P type or N type. For example, the first dopant type is one of P type, lightly doped P− type, and heavily doped P+ type, and the second dopant type is one of N type, lightly doped N− type, and heavily doped N+ type. Or conversely, the first dopant type is one of N type, lightly doped N− type, and heavily doped N+ type, and the second dopant type is one of P type, lightly doped P− type, and heavily doped P+ type. Exemplarily, the first dopant type semiconductor substrate is an N type lightly doped substrate, that is, an N− substrate, and its doping concentration is $1 \times 10^{14}/cm^3$ to $2 \times 10^{14}/cm^3$.

The first dopant type epitaxial layer is formed on the front surface of the first dopant type semiconductor substrate. Referring to FIG. 1A, a first dopant type epitaxial layer 101 is formed on the first dopant type semiconductor substrate 100. The first dopant type epitaxial layer 101 includes a first region 1, a second region 2, and a third region 3, and the third region 3 is formed between the first region 1 and the second region 2. A depletion semiconductor device is to be formed in the first region 1, an enhanced semiconductor device is to be formed in the second region 2, and an isolation structure isolating the depletion semiconductor device from the enhanced semiconductor device is to be formed in the third region 3.

The method for forming the first dopant type epitaxial layer 101 includes any of the methods known to those skilled in the art, such as ion doping vapor phase epitaxy. In this embodiment, the first dopant type semiconductor substrate is an N type lightly doped substrate, that is, an N− substrate, and the first dopant type epitaxial layer is an N type lightly doped epitaxial layer, that is, an N− epitaxial layer.

A thickness and resistivity of the first dopant type epitaxial layer 101 will affect a voltage withstand capability of the device. The thicker the thickness of the first dopant type epitaxial layer 101, the greater the resistivity thereof, and the higher the voltage withstand capability of the device. In this embodiment, when the withstand voltage of the formed VDMOS semiconductor device is required to be 650V, the thickness of the first dopant type epitaxial layer 101 is 45 μm to 65 μm, and the resistivity thereof is 15 Ω·cm to 25 Ω·cm.

At least one groove 102 is formed in the third region 3 of the first dopant type epitaxial layer 101. At least one groove 102 located in the third region 3 is provided in the first dopant type epitaxial layer 101, so as to subsequently form an isolation structure provided from the groove 102, the isolation structure blocks a current path that may be formed between the depletion device and the enhanced device and works to provide isolation between the depletion device and the enhanced device. A depth of the groove can be smaller than the thickness of the first dopant type epitaxial layer, or can be equal to or greater than the thickness of the first dopant type epitaxial layer, both can work to provide isolation. The number of the grooves will affect the isolation effect. The more the number of the grooves, the better the isolation effect. Meanwhile, compared with using a deep well to provide an isolation structure, the present disclosure uses the groove to provide the isolation structure, which effectively reduces the area of the isolation structure, thereby saving the chip area.

Exemplarily, the depth of the groove is greater than or equal to the thickness of the first dopant type epitaxial layer, that is, the groove penetrates through the first dopant type epitaxial layer. As shown in FIG. 1, the groove 102 penetrates through the first dopant type epitaxial layer 101 and extends into the semiconductor substrate 100, so as to completely blocks the current path that may be formed between the depletion device and the enhanced device at both sides of the groove and in the epitaxial layer, thereby significantly improving the isolation performance between the depletion device and the enhanced device. Meanwhile, in such a configuration, the maximum isolation effect can be achieved without providing a plurality of isolation grooves further, thus the area of the isolation structure is further reduced and the chip area is saved. In the following description, the steps of forming the isolation structure will be further described.

Exemplarily, the method for forming the groove 102 includes: firstly, form a patterned mask layer on the first dopant type epitaxial layer, the patterned mask layer exposes a position where the groove is to be formed; then, etch the first dopant type epitaxial layer using the patterned mask layer as a mask, and cause the groove penetrates through the first dopant type epitaxial layer by technical means such as endpoint detection and over etching; finally, remove the patterned mask layer. It should be understood that the step of forming the groove is merely illustrative, and any methods for forming the groove are applicable to the present disclosure.

Exemplarily, a width of the groove is 0.5 μm to 2 μm. The width of the groove is set to 0.5 μm to 2 μm, so that a thermal oxidation process can be used to fill the groove while forming dielectric islands in the subsequent process of filling the groove, thereby reducing the number of process steps and forming a dense filling material in the meantime. The depth of the groove is determined according to the thickness of the first dopant type epitaxial layer. Optionally, the shape of the groove can be rectangular, square, trapezoidal, or inverted trapezoidal, which is not limited herein. Further, a bottom of the groove can be arc, conical, or the like. Exemplarily, the groove is trapezoidal, and an inclination angle of a sidewall of the groove can be 45° to 90°. It should be understood that, the size, morphology, angle, and the like of the groove provided in this embodiment are merely exemplary, and any grooves located in the first dopant type epitaxial layer are applicable to this disclosure.

Next, continue to refer to FIG. 2, at step S2: form at least two second dopant type deep wells in each of the first region and the second region, respectively.

Figure 1B:
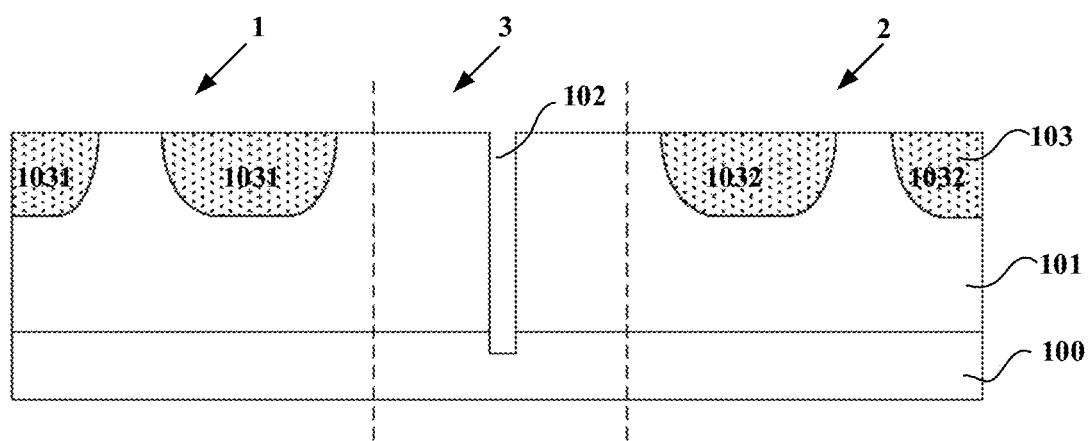

Referring to FIG. 1B, which shows a schematic diagram of a semiconductor device in which at least two second dopant type deep wells are formed in the first region, and at least two second dopant type deep wells are formed in the second region, respectively. Second dopant type deep wells 103 are formed in the first dopant type epitaxial layer 101, the second dopant type deep wells 103 includes at least two second dopant type deep wells 1031 located in the first region 1 and at least two second dopant type deep wells 1032 located in the second region 2.

A method for forming the second dopant type deep wells includes: form a patterned mask layer on the first dopant type epitaxial layer, the patterned mask layer exposes second dopant type deep well regions where the second dopant type deep wells are to be formed; perform an ion implantation to the second dopant type well regions to form second dopant type deep wells on the first dopant type epitaxial layer; and remove the patterned mask layer.

In this embodiment, the first dopant type semiconductor substrate is an N type lightly doped substrate, that is, an N− substrate; the first dopant type epitaxial layer is an N type lightly doped epitaxial layer, that is, an N− epitaxial layer; the second dopant type deep wells are P-wells; the ions of the ion implantation to the second dopant type well regions are boron ions; and an energy of the implantation is in a range of 50 KeV to 200 KeV, and a dosage of the implantation is in a range of $5.0E13/cm^2$ to $5.0E14/cm^2$.

Exemplarily, after the ion implantation to the second dopant type well regions is completed, the method further includes a step of performing an annealing on the second dopant type deep wells. Exemplarily, a temperature of this first annealing is in a range of 1100° C. to 1200° C., and a time thereof is in a range of 60 min to 300 min.

Next, continue to refer to FIG. 2, at step S3: fill the groove and form dielectric islands located on the first dopant type epitaxial layer, the dielectric islands include first dielectric islands, second dielectric islands, and a third dielectric island; the first dielectric islands partially cover a region between two adjacent second dopant type deep wells in the first region, and partially cover a region between two adjacent second dopant type deep wells in the second region; the first dielectric islands are not in contact with the two adjacent second dopant type deep wells; the second dielectric islands partially cover part of a region of each of the second dopant type deep wells in the first region, and partially cover part of a region of each of the second dopant type deep wells in the second region; the second dopant type deep wells at both sides of each of the second dielectric islands in the first region and the second dopant type deep wells at both sides of each of the second dielectric islands in the second region are regions where first dopant type source regions are to be formed; and the third dielectric island covers the groove.

Figure 1C:
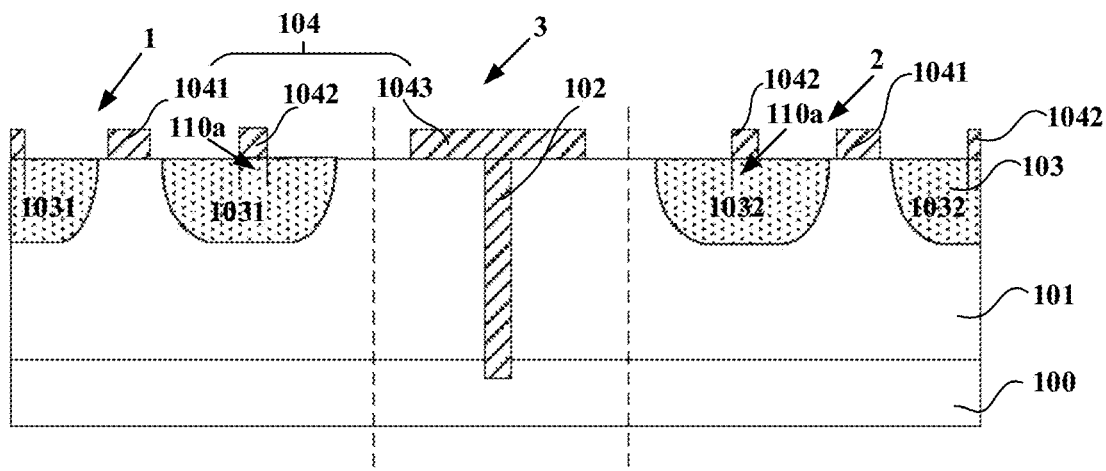

Referring to FIG. 1C, which shows a schematic diagram of a semiconductor device after filling the groove and forming dielectric islands located on the first dopant type epitaxial layer. The groove 102 is filled, and a plurality of dielectric islands 104 are formed on the first dopant type epitaxial layer 101. The dielectric islands 104 include first dielectric islands 1041, second dielectric islands 1042, and a third dielectric island 1043. The first dielectric islands 1041 are located on a region between two adjacent second dopant type deep wells 1031 in the first region 1 and on a region between two adjacent second dopant type deep wells 1032 in the second region 2. And in the first region 1, the first dielectric island 1041 is not in contact with the two adjacent second dopant type deep wells 1031; in the second region 2, the first dielectric island 1041 is not in contact with the two adjacent second dopant type deep wells 1032. The second dielectric islands 1042 are located on the second dopant type deep wells 1031 in the first region 1 and on the second dopant type deep wells 1032 in the second region 2, the second dopant type deep wells each include a region 110a covered by one of the second dielectric islands, and the region 110a is located between the first dopant type source regions to be formed, that is, the second dopant type deep well regions at both sides of the second dopant type deep well region 110a are regions where the first dopant type source regions are to be formed; and the third dielectric island 1043 covers the filled groove 102.

Exemplarily, the step of filling the groove and forming dielectric islands located on the first dopant type epitaxial layer includes: performing a deposition process to form an dielectric material layer covering the first dopant type epitaxial layer and filling the groove; and patterning the dielectric material layer to form the dielectric islands. In this process, when the material of the dielectric material layer in the groove and the material of the dielectric material layer forming the dielectric islands are the same, the filling of the groove and the formation of the dielectric islands can be placed in one same step, thus the process flow is reduced and the process cost is reduced.

Exemplarily, before the step of performing the deposition process, a thermal oxidation process is performed to form a silicon oxide layer covering the sidewall and the bottom of the groove. By forming a thermal silicon oxide layer covering the groove before filling the groove, the stress during the formation of the groove is reduced on the one hand, and a dense dielectric material layer covering the sidewall of the groove is formed on the other hand, thereby reducing the leakage. The dielectric material layer is one or a combination of oxide layer, polysilicon, TEOS and BPSG In this embodiment, the width of the groove is in a range of 0.5 μm to 2 μm. The step of filling the groove and forming dielectric islands located on the first dopant type epitaxial layer includes: performing a thermal oxidation process to form an oxide layer covering a surface of the first dopant type epitaxial layer and filling the groove; and patterning the oxide layer to form the dielectric islands. Exemplarily, the thicknesses of the dielectric islands 104 are in a range of 5000 Å to 10000 Å, and the lengths of the dielectric islands 103 are in a range of 2 μm to 5 μm.

In this embodiment, the process of covering the bottom and the sidewall of the groove, the process of filling the groove, and the step of forming the dielectric islands are performed simultaneously by using the thermal oxidation process, thus additional steps of covering the groove with a dielectric material layer and filling the groove are omitted, thereby reducing the process steps while forming a dense filling material.

It should be understood that the steps of filling the groove and forming the dielectric islands by using the thermal oxidation process in this embodiment are merely exemplary. Any methods for filling the groove and forming the dielectric islands are applicable to this disclosure.

The first dielectric islands are formed on a region between two adjacent second dopant type deep wells in each of the first region and the second region, so as to perform ion implantation using the first dielectric islands as a mask in the process of forming channel regions of the depletion device, prevent ions from entering into the region under the first dielectric island, and minimize the ion concentration of a channel region of the first dopant type epitaxial layer under the first dielectric island, so that the depletion device has higher breakdown voltage and its breakdown withstand reliability is greatly improved; and for the enhanced device, according to the formula $C_{ox}=\varepsilon_{ox}/t_{ox}$, it can be known that the thickness of the gate dielectric layer increases due to the existence of the first dielectric island, and the gate capacitance and the switching loss of the device are reduced.

The second dielectric islands are formed on the second dopant type deep well regions 110a in each of the first region and the second region, that is, the second dielectric islands are each located between regions where the first dopant type source regions are to be formed, therefore, in the process of forming the first dopant type source regions, the second dielectric islands can be used as a mask to form the first dopant type source regions by self-alignment, and the first dopant type source regions are spaced apart by the second dopant type deep well regions 110a. The photo mask and the step of obtaining the ion implantation mask by performing a photolithography process are saved in the process, so that the process cost is reduced. The step of forming the first dopant type source regions will be further described in the subsequent description.

The third dielectric island covers the filled groove, thereby forming a sealed groove structure, and forming a complete isolation structure between the enhanced device and the depletion device, so as to perform an effective isolation between the enhanced device and the depletion device.

Next, continue to refer to FIG. 2, at step S4: form first dopant type channel regions respectively on the epitaxial layer at both sides of the first dielectric island in the first region, the first dopant type channel regions extend to the regions in the first region where the first dopant type source regions are to be formed.

Figure 1D:
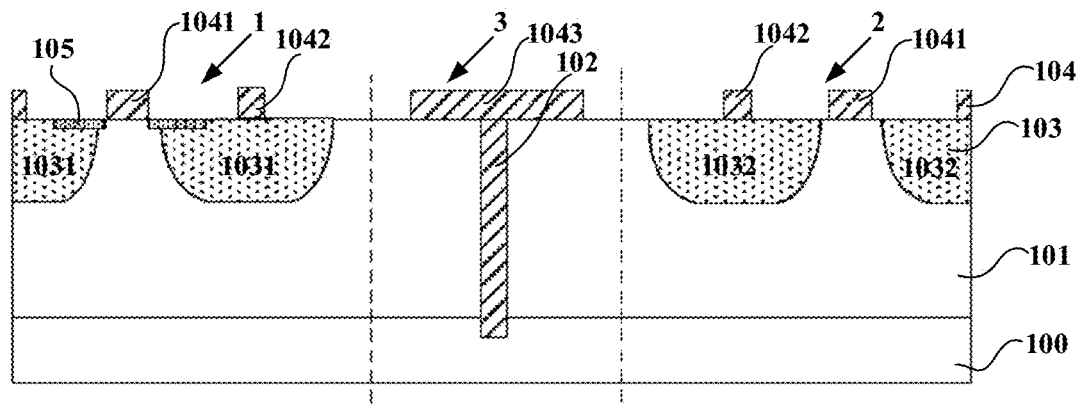

As shown in FIG. 1D, first dopant type channel regions 105 at both sides of the first dielectric island 1041 are formed in the first region 1 of the first dopant type epitaxial layer 101, and the first dopant type channel regions 105 extend to regions in the second dopant type deep wells 1031 in the first region 1 where source regions are to be formed.

Exemplarily, the step of forming first dopant type channel regions at both sides of the first dielectric island in the first region of the first dopant type epitaxial layer includes: firstly, form a patterned mask layer on the first dopant type epitaxial layer, the patterned mask layer exposes regions at both sides of the first dielectric island where the first dopant type channel regions are to be formed; perform an ion implantation to the channel regions using the patterned mask layer and the first dielectric island as a mask to form the first dopant type channel regions located at both sides of the first dielectric island; and remove the patterned mask layer.

The ions of the ion implantation to the channel regions are phosphorus ions, an energy of the implantation is in a range of 50 KeV to 200 KeV, and a dosage of the implantation is in a range of $5.0E12/cm^2$ to $5.0E13/cm^2$.

In the process of forming the channel regions of the depletion device, the ion implantation is performed using the first dielectric islands as a mask, which prevents ions from entering into the region under the first dielectric island, and minimizes the ion concentration of the channel region of the first dopant type epitaxial layer under the first dielectric island, so that the depletion device has higher breakdown voltage and its breakdown withstand reliability is greatly improved.

Exemplarily, after forming the dielectric islands, and before forming first dopant type channel regions at both sides of the first dielectric island in the first region of the first dopant type epitaxial layer, the method further includes a step of performing a threshold voltage (Vt) adjusting implantation to adjust the threshold voltage of the device, and the step of the adjusting implantation is performed by using the dielectric islands as a mask. Exemplarily, the ions of the Vt adjusting implantation are phosphorus ions, an energy of the implantation is in a range of 100 KeV to 200 KeV, and a dosage of the implantation is in a range of $1.0E12/cm^2$ to $1.0E13/cm^2$. Exemplarily, after the step of performing a Vt adjusting implantation, the method further includes a step of performing a second annealing, a temperature of the second annealing is in a range of 1100° C. to 1200° C., and a time of the second annealing is in a range of 60 min to 180 min.

Next, at step S5: form gate structures respectively covering the first dielectric islands and the third dielectric island and on the first dopant type epitaxial layer, and the gate structures expose the second dielectric islands and the regions respectively in the first region and in the second region where the first dopant type source regions are to be formed.

Exemplarily, the gate structures each include a gate dielectric layer and a gate material layer stacked in this order from bottom to top.

Figure 1E:
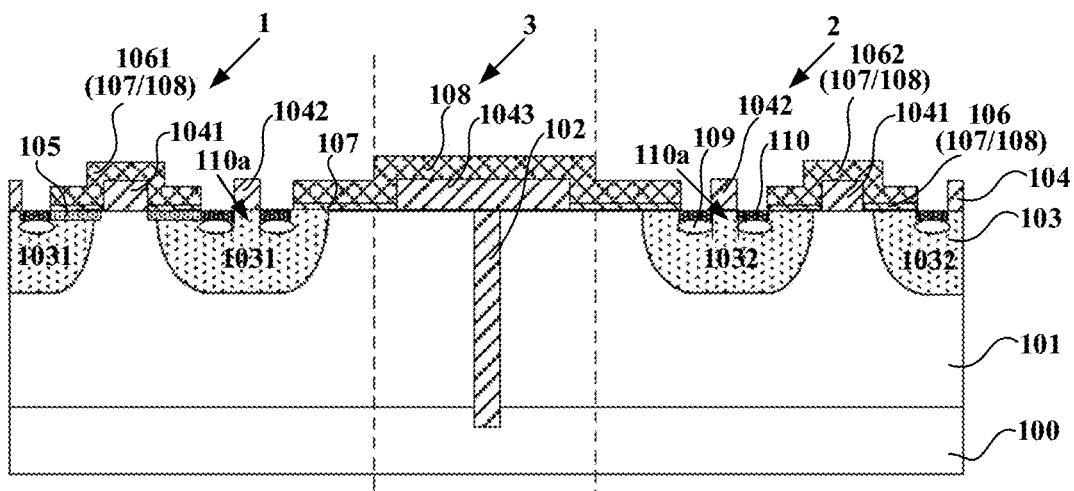

Referring to FIG. 1E, firstly, gate structures 106 are formed on the first dopant type epitaxial layer 101. The gate structures 106 include a gate structure 1061 formed on the first region 1 and a gate structure 1062 formed on the second region 2. The gate structures 106 each include a gate dielectric layer 107 and a gate material layer 108. The gate structure 1061 located on the first region 1 of the gate structures 106 covers the first dielectric island 1041 located in the first region 1, and exposes the second dielectric islands 1042 and regions in the second doping deep wells 1031 located in the first region 1 where the first dopant type source regions are to be formed; the gate structure 1062 located on the second region 1 of the gate structures 106 covers the first dielectric island 1041 located in the second region 2, and exposes the second dielectric islands 1042 and regions in the second doping deep wells 1032 located in the second region 2 where the first dopant type source regions are to be formed. Exemplarily, the gate structures 106 further cover the third dielectric island 1043.

For the enhanced device, according to the formula $C_{ox}=\varepsilon_{ox}/t_{ox}$, it can be known that the thickness of the gate dielectric layer increases due to the existence of the first dielectric island, thus the gate capacitance and the switching loss of the device are reduced.

Exemplarily, the gate dielectric layer is a silicon dioxide material, and the gate material layer is a polysilicon material. The method for forming the gate structures can be any of the methods well known to those skilled in the art, for example, the methods include process steps such as deposition, photolithography, and etching, which will not be repeated herein. Exemplarily, the thickness of the gate dielectric layer is in a range of 500 Å to 1500 Å; the thickness of the gate material layer is in a range of 2000 Å to 10000 Å.

In this embodiment, while the gate structures are formed, in the third region, the gate structure further covers the third dielectric island. As shown in FIG. 1E, the gate structures 106 further cover the third dielectric island 1043.

Next, at step S6: perform ion implantation to the first dopant type source regions using the gate structures and the second dielectric islands as a mask to form the first dopant type source regions respectively in the first region and in the second region.

Continuing to refer to FIG. 1E, an ion implantation to the first dopant type source regions is performed using the gate structures 106 and the dielectric islands 104 as a mask to form the first dopant type source regions 110 located at both sides of each of the gate structures in the second dopant type deep wells 1031 of the first region 1 and in the second dopant type deep wells 1032 of the second region 2. The first dopant type source regions 110 located in the second dopant type deep wells 1031 of the first region 1 are in contact with the first dopant type channel regions 105, and the first dopant type source regions 110 located in one same second dopant type deep well are spaced apart by the second dopant type deep well region 110a located under the second dielectric island 1042.

In the method for forming the first dopant type source regions, the ion implantation is performed using the gate structures and the second dielectric islands as a mask. Since the second dielectric islands are formed in the second dopant type deep wells in the first region and in the second dopant type deep wells in the second region, therefore, in the process of forming the first dopant type source regions, the second dielectric islands can be used as a mask to form the first dopant type source regions by self-alignment, the first dopant type source regions are located at both sides of each of the second dielectric islands, that is, the first dopant type source regions are spaced apart by the second dopant type deep well regions 110a, such that a photo mask is saved during the process, thus the process cost is reduced. In this embodiment, the step of ion implantation for forming the first dopant type source regions 110 is a step of phosphorus ion implantation, and an energy of the implantation is in a range of 50 KeV to 150 KeV and a dosage of the implantation is in a range of $5.0E15/cm^2$ to $1.0E16/cm^2$.

Exemplarily, after forming the first dopant type source regions, second dopant type well regions under the first dopant type source regions are formed. Forming the second dopant type well regions under the first dopant type source regions can significantly reduce the resistance of the base region of the parasitic transistor, greatly reduce the risk of switching on the parasitic transistor, and significantly improve the working stability of the device. With continued reference to FIG. 1E, second dopant type well regions 109 are formed under the first dopant type source regions 110. In the method for forming the second dopant type well regions, an ion implantation is performed using the gate structures and the second dielectric islands as a mask. In this embodiment, the step of ion implantation for forming the second dopant type well regions 109 is a step of boron ion implantation, an energy of the implantation is in a range of 150 KeV to 300 KeV, and a dosage of the implantation is in a range of $1.0E15/cm^2$ to $5.0E15/cm^2$.

Exemplarily, after forming the first dopant type source regions, the method further includes a step of forming source electrodes. Exemplarily, the step of forming source electrodes includes: forming a dielectric layer on the first dopant type epitaxial layer, the dielectric layer covers the gate structures and the first dopant type source regions and exposes the second dielectric islands; removing the second dielectric islands; removing part of the dielectric layer to expose part of each of the first dopant type source regions; forming source electrodes on the first dopant type epitaxial layer, the source electrodes include a first region source electrode in contact with the second dopant type deep wells of the first region and a second region source electrode in contact with the second dopant type deep wells of the second region, and the first region source electrode is not in contact with the second region source electrode.

Exemplarily, before forming the source electrodes, the method further includes a step of forming second dopant type well regions and second dopant type source regions. The process of forming the source electrodes after forming the second dopant type source regions is described below with reference to FIGS. 1F and 1G.

Figure 1F:
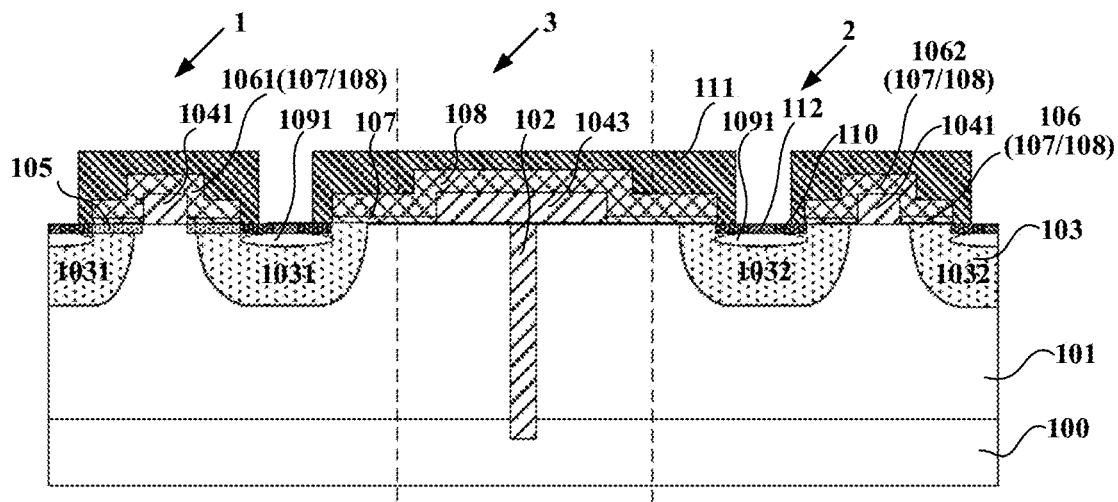

Firstly, referring to FIG. 1F, a dielectric layer covering the gate structures (including the gate dielectric layers 107 and the gate material layers 108) and the first dopant type source regions 110 is formed on the first dopant type epitaxial layer 101, and the dielectric layer exposes the second dielectric islands 1042. The dielectric layer can be a dielectric material layer such as silicon dioxide or silicon nitride. The method for forming the dielectric layer includes steps such as deposition, photolithography, and etching, and these are steps well known to those skilled in the art, which will not be repeated herein.

Next, continue to refer to FIG. 1F, the second dielectric islands 1042 and part of the dielectric layer are removed, such that part of each of the first dopant type source regions 110 in the second dopant type deep wells 1031 of the first region and in the second dopant type deep wells 1032 of the second region, and regions between the first dopant type source regions 110 are exposed. The method for removing the second dielectric islands and part of the dielectric layer may be methods well known to those skilled in the art, such as etching, which will not be repeated herein.

Next, continue to refer to FIG. 1F, second dopant type source regions 112 located between the second dopant type deep wells 1031 of the first region and between the second dopant type deep wells 1032 of the second region are formed, the second dopant type source regions 112 are connected to the first dopant type source regions 112.

In the step of ion implantation for forming the second dopant type source regions, the remaining dielectric layer 111 is used as a mask. In this embodiment, the second dopant type source regions are formed after the dielectric layer is partially removed and before the source electrodes are formed, and a dosage of the ion implantation for forming the second dopant type source regions is less than that of the ion implantation for forming the first dopant type source region, so that during the process of forming the second dopant type source regions, the exposed first dopant type source regions will not be converted into the other type, thereby separately performing the step of forming the ion implantation mask for the second dopant type source regions, reducing the process flow, and reducing the process cost. The second dopant type source regions are used to enhance the contacts between the source electrodes and the deep wells.

In this process, since the dielectric layer is partially removed before forming the second dopant type source regions, openings exposing the first dopant type source regions are formed, thereby after the second dopant type source regions are formed, source electrodes in contact with the first dopant type source regions and the second dopant type source regions can be formed directly without further removing the dielectric layer. Thus the number of process steps is further reduced and the process cost is saved.

In this embodiment, the step of the ion implantation for forming the second dopant type source regions is a step of a boron ion implantation or a boron difluoride ion implantation, and an energy of the implantation is in a range of 50 KeV to 200 KeV and a dosage of the implantation is in a range of $5.0E14/cm^2$ to $5.0E15/cm^2$.

It should be understood that the second dopant type source regions are formed after the dielectric layer is partially removed and before the source electrodes are formed is merely exemplary, and any steps of forming the second dopant type source regions are applicable to the present disclosure.

Next, continue to refer to FIG. 1F, a step of ion implantation is performed to form another second dopant type well regions under the second dopant type source regions 112. The another second dopant type well regions are connected to the second dopant type well regions 109 under the first dopant type source regions 110 to form complete second dopant type well regions 1091 under the first dopant type source regions 110 and the second dopant type source regions 112. In the step of ion implantation for forming another second dopant type well regions, the remaining dielectric layer 111 is used as a mask, and a boron ion implantation process is used, an energy of the implantation is in a range of 150 KeV to 300 KeV, and a dosage of the implantation is in a range of $1.0E15/cm^2$ to $1.0E16/cm^2$. Exemplarily, an annealing is performed after completing the step of the ion implantation to the another second dopant type well regions. A temperature of the annealing is in a range of 800° C. to 1000° C., and a time of the annealing is in a range of 30 min to 90 min. Forming the second dopant type well regions 1091 under the first dopant type source regions 110 and the second dopant type source regions 112 can significantly reduce the resistance of the base region of the parasitic transistor, greatly reduce the risk of switching on the parasitic transistor, and significantly improve the working stability of the device.

Finally, referring to FIG. 1, source electrodes 113 are formed, the source electrodes 113 include a first region source electrode 1131 and a second region source electrode 1132, the first region source electrode 1131 is in contact with the first dopant type source regions 110 and the second dopant type source regions 112 in the first region 1, the second region source electrode 1132 is in contact with the first dopant type source regions 110 and the second dopant type source regions 112 in the second region 2, and the first region source electrode 1131 is not in contact with the second region source electrode 1132. The source electrodes are made of one of conventional aluminum and copper, or are made of an alloy of several of the conventional aluminum and copper.

The step of forming the source electrodes 113 includes: depositing a source material layer, and patterning the source material layer to form the source electrodes. The steps of etching the dielectric layer, depositing the source material layer, and patterning the source material layer are processes well known to those skilled in the art, which will not be repeated herein.

After the source electrodes are formed, the method further includes a step of forming a drain electrode. Exemplarily, the step of forming the drain electrode includes: firstly, thinning a back surface of the first dopant type semiconductor substrate; and then, depositing the back surface of the first dopant type semiconductor substrate to form the drain electrode. The drain electrode is made of one of conventional aluminum and copper, or is made of an alloy of several of the conventional aluminum and copper. As shown in FIG. 1, the drain electrode 114 is formed on the back surface of the first dopant type semiconductor substrate 100.

Up to this point, the manufacturing method for a semiconductor device of the present disclosure has been exemplarily introduced. According to the manufacturing method for a semiconductor device and the semiconductor device of the present disclosure, dielectric islands on the epitaxial layer and grooves in the epitaxial layer are formed during the manufacturing process of a semiconductor device integrated with an enhanced device and a depletion device. In the process of forming the channel regions of the depletion device, since the existence of the dielectric island blocks the ion implantation to the channel regions, the ion concentration under the dielectric island is low, such that the breakdown withstand reliability of the device in the on state is greatly improved; meanwhile, the existence of the dielectric island makes the thickness of the gate dielectric layer increases, reduces the gate capacitance, and reduces the switching loss of the device. The grooves located in the epitaxial layer are disposed as an isolation structure between the enhanced device and the depletion device, which improves the isolation performance between the enhanced device and the depletion device on the one hand, and reduces the chip area occupied by the isolation structure on the other hand. In addition, during the manufacturing process, the dielectric islands are used as a mask, and the first dopant type source regions can be formed by self-alignment, which saves a piece of photo mask and saves the process steps for forming an ion implantation mask by photolithography, thus reduces the process cost.

It should be understood that, in this embodiment, the steps of forming the second dopant type source regions between the first dopant type source regions, and forming the source electrodes and the drain electrode are merely exemplary, those skilled in the art may form the source electrodes and the drain electrode using processes well known in the art, and these steps are not intended to limit the disclosure to the scope of the described embodiments. The protection scope of the present disclosure is defined by the appended claims and equivalent scope thereof.

Meanwhile, it should be understood that, the VDMOS device described as an example in this embodiment is merely exemplary and is not intended to limit the scope of the present disclosure. Those skilled in the art may form an IGBT device and the like according to their needs.

Exemplarily, the semiconductor device according to the present disclosure can also be provided as an IGBT device, in which the semiconductor substrate of the above VDMOS device is set to be of the second dopant type, for example, the semiconductor substrate is a P+ type substrate, and the positions and dopant types of other components are unchanged, and a depletion IGBT device is formed in the first region and an enhanced IGBT device is formed in the second region. Further, exemplarily, the IGBT device is used in parallel with a fast recovery diode to improve the current sharing effect of the device and the stability and reliability of the system operation.

Embodiment 2

The present disclosure further provides an integrated semiconductor device, the integrated semiconductor device includes an integrated semiconductor device manufactured according to the method described in the Embodiment 1.

The structure of the semiconductor device of the present disclosure will be described exemplarily below with reference to FIG. 1G The integrated semiconductor device includes a semiconductor substrate 100. Specifically, the semiconductor substrate 100 may be at least one of the following materials: Si, Ge, SiGe, SiC, SiGeC, InAs, GaAs, InP, InGaAs, or other IIIN compound semiconductors, or it further includes multilayer structures made of these semiconductors, or it is silicon on insulator (SOI), stacked silicon on insulator (SSOI), stacked silicon germanium on insulator (S—SiGeOI), silicon germanium on insulator (SiGeOI), germanium on insulator (GeOI), and the like. Exemplarily, the semiconductor substrate of this embodiment is of a first dopant type.

It should be noted that the first dopant type and the second dopant type in this specification generally refer to P type or N type. The first dopant type and the second dopant type are opposite to each other. For example, the first dopant type is one of P type, lightly doped P− type, and heavily doped P+ type, and the second dopant type is one of N type, lightly doped N− type, and heavily doped N+ type. Or conversely, the first dopant type is one of N type, lightly doped N− type, and heavily doped N+ type, and the second dopant type is one of P type, lightly doped P− type, and heavily doped P+ type. Exemplarily, the first dopant type semiconductor substrate is an N type lightly doped substrate, that is, an N− substrate, and its doping concentration is $1 \times 10^{14}/cm^3$ to $2 \times 10^{14}/cm^3$.

A first dopant type epitaxial layer 101 is formed on a front surface of the first dopant type semiconductor substrate 100. In this embodiment, the first doping semiconductor substrate is an N type lightly doped substrate, that is, an N− substrate, and the first dopant type epitaxial layer is an N type lightly doped epitaxial layer, that is, an N− epitaxial layer. Exemplarily, a thickness and resistivity of the first dopant type epitaxial layer 101 will affect a voltage withstand capability of the device. The thicker the thickness of the first dopant type epitaxial layer 101 is and the greater the resistivity thereof is, the higher the voltage withstand capability of the device is. In this embodiment, when the withstand voltage of the formed VDMOS semiconductor device is required to be 650V, the thickness of the first dopant type epitaxial layer 101 is 45 μm to 65 μm, and the resistivity thereof is 15 Ω·cm to 25 Ω·cm.

The first dopant type epitaxial layer 101 includes a first region 1, a second region 2, and a third region 3; a depletion device is formed in the first region 1, an enhanced device is formed in the second region 2, a groove 102 is formed in the third region 3, and the groove is filled with a dielectric material to isolate the depletion device from the enhanced device. An isolation structure provided by the groove 102 blocks a current path that may be formed between the depletion device and the enhanced device to play a role of isolation between the depletion device and the enhanced device. A depth of the groove may be smaller than the thickness of the first dopant type epitaxial layer, or may be equal to or greater than the thickness of the first dopant type epitaxial layer, both can work to provide isolation. The number of the grooves will affect the isolation effect. The more the number of the grooves, the better the isolation effect. Meanwhile, compared with using a deep well to provide an isolation structure, the present disclosure uses the groove to provide the isolation structure, thus the area of the isolation structure is effectively reduced, and thereby the chip area is saved.

Exemplarily, the depth of the groove is greater than or equal to the thickness of the first dopant type epitaxial layer, that is, the groove penetrates through the first dopant type epitaxial layer. As shown in FIG. 1, the groove 102 penetrates through the first dopant type epitaxial layer 101 and extends into the semiconductor substrate 100, so as to completely block the current path that may be formed between the depletion device and the enhanced device located at both sides of the groove and in the epitaxial layer, thereby significantly improving the isolation performance between the depletion device and the enhanced device. Meanwhile, in such a configuration, the maximum isolation effect can be achieved without providing a plurality of isolation grooves further, thus the area of the isolation structure is further reduced and the chip area is saved.

Exemplarily, the dielectric material filling the groove and the material of the dielectric islands are one same material. Further, exemplarily, the dielectric material filling the groove and the material of the dielectric islands are thermal silicon oxide layers. Thereby reducing the number of process steps in the manufacturing process.

Figure 1G:
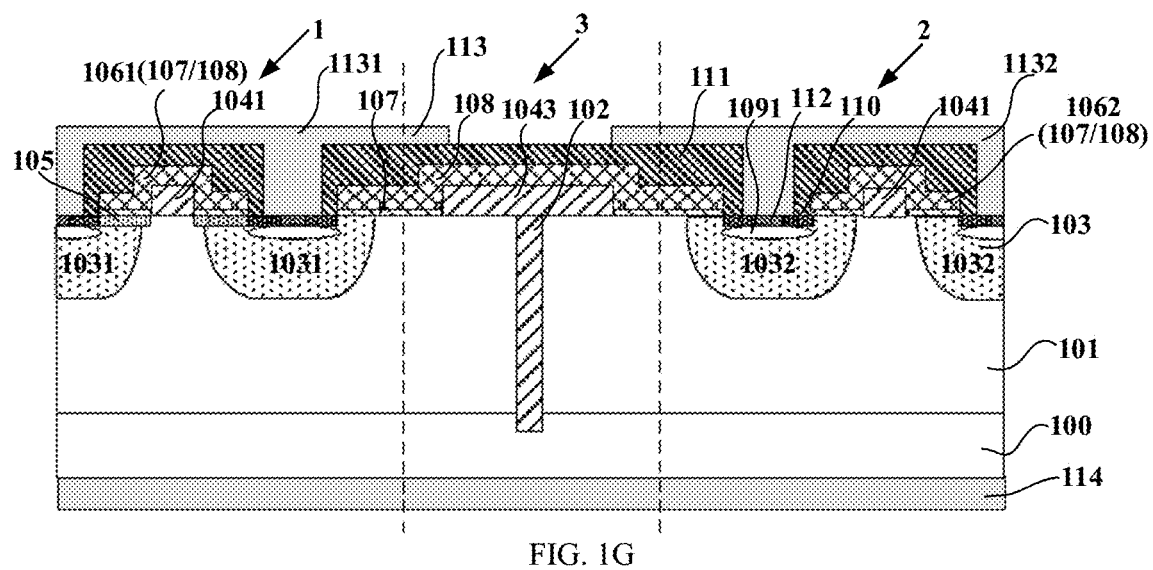

Continue to refer to FIG. 1G the semiconductor device of the present disclosure further includes second dopant type deep wells 103 formed in the first dopant type epitaxial layer 101, the second dopant type deep wells 103 include at least two second dopant type deep wells 1031 located in the first region 1 and at least two second dopant type deep wells 1032 located in the second region 2. In this embodiment, the first dopant type semiconductor substrate is an N type lightly doped substrate, that is, an N− substrate, the first dopant type epitaxial layer is an N type lightly doped epitaxial layer, that is, an N− epitaxial layer, and the second dopant type deep wells are P wells.

Continue to refer to FIG. 1G the semiconductor device of the present disclosure further includes a plurality of dielectric islands 104 formed on the first dopant type epitaxial layer 101, and the dielectric islands 104 include first dielectric islands 1041 and a third dielectric island 1043.

The first dielectric islands 1041 are located above a region between two adjacent second dopant type deep wells 1031 in the first region 1 and located above a region between two adjacent second dopant type deep wells 1032 in the second region 2. In the first region 1, the dielectric island 1041 is not in contact with the two adjacent second dopant type deep wells 1031, and in the second region 2, the dielectric island 1041 is not in contact with the two adjacent second dopant type deep wells 1032.

The first dielectric islands 1041 are formed above regions between two adjacent second dopant type deep wells in each of the first region and the second region, thereby the first dielectric islands 1041 are used as a mask to perform ion implantation in the process of forming the channel regions of the depletion device. Since the existence of the dielectric island blocks the ion implantation to the channel regions, the ion concentration under the dielectric island is low, such that the breakdown withstand reliability of the device in the on state is greatly improved.

The third dielectric island 1043 covers the filled groove, thereby forming a sealed groove structure, and forming a complete isolation structure located between the enhanced device and the depletion device, so as to perform effective isolation between the enhanced device and the depletion device. Exemplarily, the material of the dielectric islands and the material filling the groove are one same material. Exemplarily, a width of the groove is 0.5 μm to 2 μm.

Exemplarily, the material of the dielectric islands and the material filling the groove are one same material and are a thermal oxide layer.

Continue to refer to FIG. 1G, the semiconductor device of the present disclosure further includes gate structures 106 formed on the first region 1 and the second region 2. The gate structures 106 include a gate structure 1061 formed on the first region 1 and a gate structure 1062 formed on the second region 2. The gate structures 106 each include a gate dielectric layer 107 and a gate material layer 108; the gate structure 1061 in the first region 1 partially covers each of the adjacent second dopant type deep wells 1031 in the first region 1, the gate structure 1062 in the second region 2 partially covers each of the adjacent second dopant type deep wells 1032 in the second region 2, and a plurality of dielectric islands 1041 are covered under the gate structures 106. The first dielectric island 1041 is covered under the gate structure. According to the formula $C_{ox}=\varepsilon_{ox}/t_{ox}$, it can be known that the thickness of the gate dielectric layer increases due to the existence of the first dielectric island, which reduces the gate capacitance and reduces the switching loss of the device. In this embodiment, as shown in FIG. 1G the gate structures 106 further cover the third dielectric island 1043.

The gate structures 106 and the material of the gate structures can be any materials well known to those skilled in the art. Exemplarily, the gate dielectric layer is a silicon dioxide material, and the gate material layer is a polysilicon material. Exemplarily, a thickness of the gate dielectric layer is in a range of 500 Å to 1500 Å; a thickness of the gate material layer is in a range of 2000 Å to 10000 Å.

Continue to refer to FIG. 1G the semiconductor device of the present disclosure further includes first dopant type source regions 110 located in the second dopant type deep wells 103 formed at both sides of each of the gate structures 106, the first dopant type source regions 110 located in one same second dopant type deep well 103 are spaced apart by part of a region of the second dopant type deep well 103.

Continue to refer to FIG. 1, the semiconductor device of the present disclosure further includes first dopant type channel regions at both sides of the dielectric island 104 in the first region 1, the first dopant type channel regions extend laterally to the outside of the adjacent first dopant type source regions 110.

Exemplarily, as shown in FIG. 1G the semiconductor device further includes second dopant type source regions 112 provided respectively in the second dopant type deep wells 1031 in the first region 1 and in the second dopant type deep wells 1032 in the second region 2, and the second dopant type source regions 112 are used to enhance the contacts between the source electrodes and the deep wells.

Exemplarily, as shown in FIG. 1G the semiconductor device further includes second dopant type well regions 1091 provided respectively in the second dopant type deep wells 1031 in the first region 1 and in the second dopant type deep wells 1032 in the second region 2. The second dopant type well regions 1091 are located under the first dopant type source regions 110 and the second dopant type source regions 112. Forming the second dopant type well regions 1091 under the first dopant type source regions 110 and the second dopant type source regions 112 can significantly reduce the resistance of the base region of the parasitic transistor, greatly reduce the risk of switching on the parasitic transistor, and significantly improve the operation stability of the device.

Exemplarily, as shown in FIG. 1G the semiconductor device further includes source electrodes formed on the first dopant type epitaxial layer, and the source electrodes 113 include a first region source electrode 1131 and a second region source electrode 1132. The first region source electrode 1131 is in contact with the second dopant type deep wells 1021 in the first region and the first dopant type source regions 110 located in the second dopant type deep wells 1021, and the second region source electrode 1132 is in contact with the second dopant type deep wells 1022 in the second region 2 and the first dopant type source regions 110 located in the second dopant type deep wells 1022, and the first region source electrode 1131 is not in contact with the second region source electrode 1132. Thus, an independent source electrode of the depletion semiconductor device and an independent source electrode of the enhanced semiconductor device are formed. In this embodiment, the second dopant type source regions 112 are formed in the second dopant type deep wells 1021 in the first region 1 and in the second dopant type deep wells 1022 in the second region 2. The first region source electrode 1131 is in contact with the first dopant type source regions 110 and the second dopant type source regions 112 in the first region 1, and the second region source electrode 1132 is in contact with the first dopant type source regions 110 and the second dopant type source regions 112 in the second region 2.

Exemplarily, as shown in FIG. 1G the semiconductor device further includes a drain electrode 114 formed on a back surface of the first dopant type semiconductor substrate 100. Thus, a complete integrated VDMOS device integrated with a depletion VDMOS device and an enhanced VDMOS device is formed. It should be understood that, the VDMOS device described as an example in this embodiment is merely illustrative and is not intended to limit the scope of the present disclosure. Those skilled in the art may form an IGBT device and the like according to their needs.

Exemplarily, an IGBT device is provided according to a semiconductor device of the present disclosure, in which the semiconductor substrate of the above VDMOS device is set to be of the second dopant type, that is, the semiconductor substrate is a P+ type substrate, and the positions and dopant types of other components are unchanged, and a depletion IGBT device is provided in the first region and an enhanced IGBT device is formed in the second region. Further, exemplarily, the IGBT device is used in parallel with a fast recovery diode to improve the current sharing effect of the device and the stability and reliability of the system operation. Meanwhile, in order to expand the disclosure field and efficiency of the devices, a variety of semiconductor devices can be integrated together as required, for example, further integrating one or more semiconductor devices such as diodes, triodes, resistors, capacitors, JFETs, current-sensing VDMOSs and CMOSs on the above described integrated semiconductor device, and an isolation structure is provided between the depletion semiconductor device and an another type semiconductor device to prevent punch-through between the semiconductor devices.

The technical features of the embodiments described above may be arbitrarily combined. To simplify the description, not all possible combinations of the technical features in the above embodiments are described. However, all of the combinations of these technical features should be considered as within the scope of this disclosure, as long as such combinations do not contradict with each other.

The above-described embodiments merely represent several embodiments of the present disclosure, and the descriptions thereof are more specific and detailed, but they should not be construed as limitations to the scope of the present disclosure. It should be noted that, for a person of ordinary skill in the art, several variations and improvements may be made without departing from the concept of the present disclosure, and these are all within the protection scope of the present disclosure. Therefore, the protection scope of the present disclosure shall be subject to the appended claims.

What is claimed is:

1. A manufacturing method for a semiconductor device, comprising:

providing a semiconductor substrate, forming a first dopant type epitaxial layer having a first region, a second region, and a third region on a front surface of the semiconductor substrate, the third region being located between the first region and the second region, and forming at least one groove located in the first dopant type epitaxial layer in the third region;

forming at least two second dopant type deep wells respectively in each of the first region and the second region;

filling the groove and forming dielectric islands located on the first dopant type epitaxial layer, the dielectric islands including first dielectric islands, second dielectric islands, and a third dielectric island; the first dielectric islands partially covering a region between two adjacent second dopant type deep wells in the first region, and partially covering a region between two adjacent second dopant type deep wells in the second region; the first dielectric islands being not in contact with the two adjacent second dopant type deep wells; the second dielectric islands partially covering part of a region of each of the second dopant type deep wells in the first region and partially covering part of a region of each of the second dopant type deep wells in the second region; the second dopant type deep wells at both sides of each of the second dielectric islands in the first region and the second dopant type deep wells at both sides of each of the second dielectric islands in the second region being regions where first dopant type source regions are to be formed; and the third dielectric island covering the groove;

forming first dopant type channel regions respectively on the epitaxial layer at both sides of the first dielectric island in the first region, the first dopant type channel regions extending to regions in the first region where first dopant type source regions are to be formed;

forming gate structures respectively covering the first dielectric islands and the third dielectric island and on the first dopant type epitaxial layer, the gate structures exposing the second dielectric islands and the regions respectively in the first region and in the second region where the first dopant type source regions are to be formed; and performing ion implantation to the first dopant type source regions using the gate structures and the second dielectric islands as a mask to form the first dopant type source regions respectively in the first region and in the second region;

wherein, the first dopant type and the second dopant type are opposite to each other.

2. The manufacturing method according to claim 1, wherein a depth of the groove is equal to or greater than a thickness of the first dopant type epitaxial layer.

3. The manufacturing method according to claim 2, after the ion implantation on the second dopant type well regions, further comprising a step of performing an annealing process to the second dopant type well regions, wherein a temperature of the annealing process to the second dopant type well regions is in a range of 1100° C. to 1200° C., and a time thereof is in a range of 60 min to 300 min.

4. The manufacturing method according to claim 1, wherein thicknesses of the dielectric islands are in a range of 5000 Å to 10000 Å.

5. The manufacturing method according to claim 1, wherein lengths of the dielectric islands are in a range of 2 μm to 5 μm.

6. The manufacturing method according to claim 1, wherein a width of the groove is in a range of 0.5 μm to 2 μm.

7. The manufacturing method according to claim 1, wherein the step of filling the groove and forming dielectric islands located on the first dopant type epitaxial layer comprises:

forming a dielectric material layer covering the first dopant type epitaxial layer and filling the groove; and patterning the dielectric material layer to form the dielectric islands.

8. The manufacturing method according to claim 2, after the step of forming the first dopant type source regions, further comprising a step of forming source electrodes:

forming a dielectric layer on the first dopant type epitaxial layer, the dielectric layer covering the gate structures and the first dopant type source regions and exposing the second dielectric islands;

removing the second dielectric islands and removing part of the dielectric layer to form openings, the openings exposing part of each of the first dopant type source regions located in the second dopant type deep wells and regions located under the second dielectric islands;

forming the source electrodes on the first dopant type epitaxial layer, the source electrodes filling the openings;

wherein, the source electrodes include a first region source electrode and a second region source electrode, the first region source electrode is in contact with the second dopant type deep wells located in the first region and the first dopant type source regions located in the second dopant type deep wells, the second region source electrode is in contact with the second dopant type deep wells located in the second region and the first dopant type source regions located in the second dopant type deep wells, and the first region source electrode is not in contact with the second region source electrode.

9. The manufacturing method according to claim 8, wherein after the step of forming the first dopant type source regions and before the step of forming the source electrodes, performing ion implantation to the second dopant type source regions using the remaining dielectric layer as a mask to form second dopant type source regions in regions between the first dopant type source regions; wherein a dosage of the ion implantation for forming the second dopant type source regions is less than a dosage of the ion implantation for forming the first dopant type source regions.

10. The manufacturing method according to claim 9, wherein after the step of forming the second dopant type source regions and before the step of forming the source electrodes, forming another second dopant type well regions under the second dopant type source regions, the another second dopant type well regions are each connected to the second dopant type well regions on both sides thereof.

11. The manufacturing method according to claim 9, wherein in the step of performing ion implantation to the second dopant type source regions, an energy of the ion implantation is in a range of 50 KeV to 200 KeV, and a dosage of the implantation is in a range of $5.0E14/cm^2$ to $5.0E15/cm^2$.

12. The manufacturing method according to claim 1, wherein a thickness of the first dopant type epitaxial layer is 45 μm to 65 μm.

13. The manufacturing method according to claim 1, wherein the groove is trapezoidal, and an inclination angle of a sidewall of the groove is in a range of 45° to 90°.

14. The manufacturing method according to claim 1, before filling the groove, further comprising:
    forming a thermal silicon oxide layer on a sidewall and a bottom of the groove.

15. The manufacturing method according to claim 1, after forming the dielectric islands and before forming the first dopant type channel regions, further comprising a step of a threshold voltage adjusting implantation to adjust a threshold voltage of the device.

16. The manufacturing method according to claim 1, after forming the source electrodes, further comprising: forming a drain electrode on a back surface of the first dopant type semiconductor substrate.

17. The manufacturing method according to claim 1, wherein in the step of performing ion implantation to the first dopant type source regions, an energy of the ion implantation is in a range of 50 KeV to 150 KeV, and a dosage of the implantation is in a range of $5.0E15/cm^2$ to $1.0E16/cm^2$.

18. The manufacturing method according to claim 1, wherein the semiconductor substrate is a first dopant type semiconductor substrate, the semiconductor device includes a VDMOS device, and a depletion VDMOS device is formed in the first region, and an enhanced VDMOS device is formed in the second region; or the semiconductor substrate is a second dopant type semiconductor substrate, the semiconductor device includes an IGBT device, and a depletion IGBT device is formed in the first region, and an enhanced IGBT device is formed in the second region.

19. An integrated semiconductor device comprising a semiconductor device manufactured by the manufacturing method according to claim 1.

20. The manufacturing method according to claim 1, wherein the forming the at least two second dopant type deep wells comprises:
    forming a patterned mask layer on the first dopant type epitaxial layer, the patterned mask layer exposing second dopant type well regions where the second dopant type deep wells are to be formed;
    performing an ion implantation to the second dopant type well regions to form second dopant type deep wells on the first dopant type epitaxial layer; and
    removing the patterned mask layer.

* * * * *